(12) United States Patent
Zhang et al.

(10) Patent No.: US 12,278,348 B2
(45) Date of Patent: Apr. 15, 2025

(54) SYSTEM AND METHOD FOR DIFFERENTIATING SHORTING IN A BATTERY

(71) Applicant: Celgard, LLC, Charlotte, NC (US)

(72) Inventors: Zhengming Zhang, Rock Hill, SC (US); Weifeng Fang, Charlotte, NC (US)

(73) Assignee: Celgard, LLC, Charlotte, NC (US)

( * ) Notice: Subject to any disclaimer, the term of this patent is extended or adjusted under 35 U.S.C. 154(b) by 235 days.

(21) Appl. No.: 17/175,793

(22) Filed: Feb. 15, 2021

(65) Prior Publication Data

US 2021/0167428 A1 Jun. 3, 2021

Related U.S. Application Data

(62) Division of application No. 16/877,954, filed on May 19, 2020, now Pat. No. 10,921,385, which is a (Continued)

(51) Int. Cl.
*H01M 10/42* (2006.01)
*G01R 31/52* (2020.01)
(Continued)

(52) U.S. Cl.
CPC ........ *H01M 10/4285* (2013.01); *G01R 31/52* (2020.01); *H01M 10/48* (2013.01);
(Continued)

(58) Field of Classification Search
CPC ............. H01M 10/4285; H01M 10/48; H01M 10/486; H01M 2220/10; H01M 2220/20; G01R 31/52; G01R 31/382
(Continued)

(56) References Cited

U.S. PATENT DOCUMENTS 8,059,007 B2 * 11/2011 Hermann ............ H01M 10/486
340/636.11
2006/0186859 A1 8/2006 Fukijawa et al.
(Continued)

FOREIGN PATENT DOCUMENTS

JP 2008305752 12/2008
JP 2012052857 3/2012
(Continued)

OTHER PUBLICATIONS

D. Linden; "Handbook of Batteries," Second Edition, McGraw Hill, Inc. (New York, NY) (1995).
(Continued)

*Primary Examiner* — Raul J Rios Russo
*Assistant Examiner* — Trung Q Nguyen
(74) *Attorney, Agent, or Firm* — J. Clinton Wimbish; Maynard Nexsen PC

(57) ABSTRACT

A system for differentiating short circuiting in a battery includes: a detector coupled to the battery; a monitor in communication with the detector, the monitor including a profile of a battery shorting behavior, and a comparator for matching data from the detector to the profile; and a controller for taking action based upon information from the detector. A method for detecting short circuiting in a battery includes the steps of: detecting a behavior of the battery; comparing the behavior of the battery to a predetermined battery behavior profile; determining the type of short based on the comparison; and taking mitigating action based on the determination. The system/method may monitor temperature of the battery, heat generation from the battery, current flow through the battery, voltage drop across the battery, and/or combinations thereof. The system/method discriminates between the various battery shorting behaviors for aggressive response or passive response.

3 Claims, 11 Drawing Sheets

Related U.S. Application Data division of application No. 14/754,744, filed on Jun. 30, 2015, now Pat. No. 10,656,195.

(60) Provisional application No. 62/018,930, filed on Jun. 30, 2014.

(51) Int. Cl.
  *H01M 10/48* (2006.01)
  *G01R 31/382* (2019.01)

(52) U.S. Cl.
  CPC ......... *G01R 31/382* (2019.01); *H01M 10/486* (2013.01); *H01M 2220/10* (2013.01); *H01M 2220/20* (2013.01)

(58) Field of Classification Search
  USPC .................................. 324/425–434, 423–434
  See application file for complete search history.

(56) References Cited

U.S. PATENT DOCUMENTS

| | | | |
|---|---|---|---|
| 2010/0141215 A1 | 6/2010 | Takeda | |
| 2010/0194398 A1 | 8/2010 | Kawasumi et al. | |
| 2011/0148426 A1* | 6/2011 | Yokotani | H01M 10/48 324/537 |
| 2011/0181246 A1 | 7/2011 | Tae et al. | |
| 2011/0226559 A1* | 9/2011 | Chen | G01R 31/367 187/290 |
| 2011/0298417 A1* | 12/2011 | Stewart | H02J 7/0029 320/132 |
| 2015/0197162 A1* | 7/2015 | Martin | B60K 35/00 903/903 |
| 2015/0377948 A1* | 12/2015 | Zhang | G01R 31/52 324/426 |
| 2016/0003917 A1* | 1/2016 | You | G01R 31/367 702/63 |
| 2020/0278400 A1* | 9/2020 | Zhang | H01M 10/48 |

FOREIGN PATENT DOCUMENTS

| | | | | |
|---|---|---|---|---|
| JP | 2014022282 | | 2/2014 | |
| KR | 20050049364 | * | 5/2005 | ........ H01M 10/0525 |

OTHER PUBLICATIONS

J.O. Besenhard, "Handbook of Battery Materials," Wiley-VCH (New York, NY) (1999).

P. Arora and Z. Zhang, "Battery Separators," Chem. Rev., (vol. 104), (pp. 4419-4462), (2004).

* cited by examiner

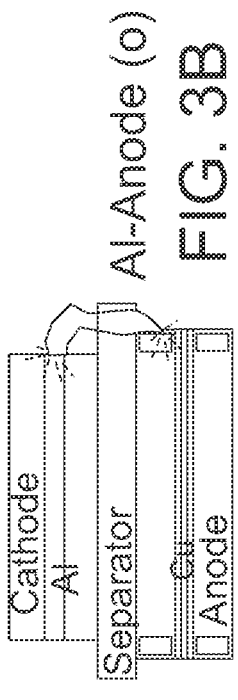
FIG. 3A Al-Anode (i)
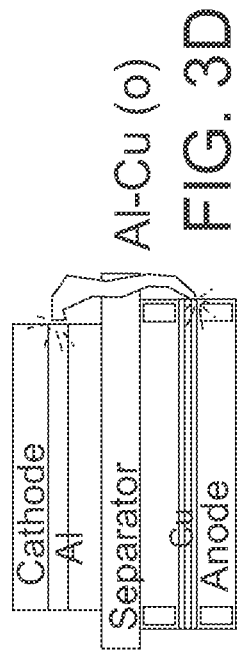
FIG. 3C Al-Cu (i)
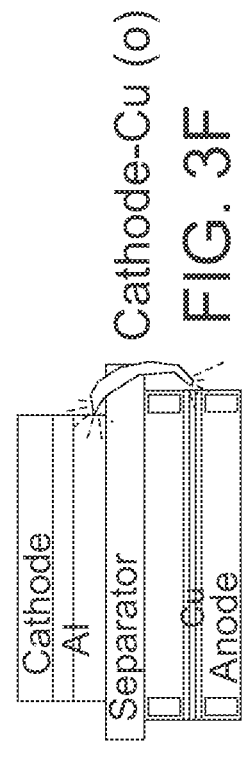
FIG. 3E Cathode-Cu (i)
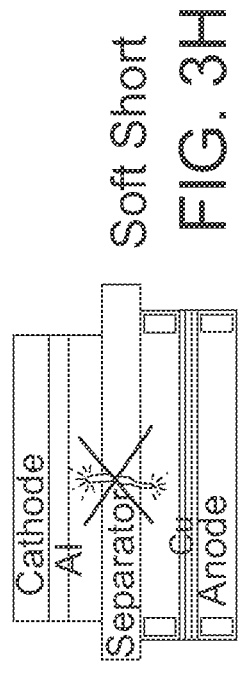
FIG. 3G Cathode-Anode (i)
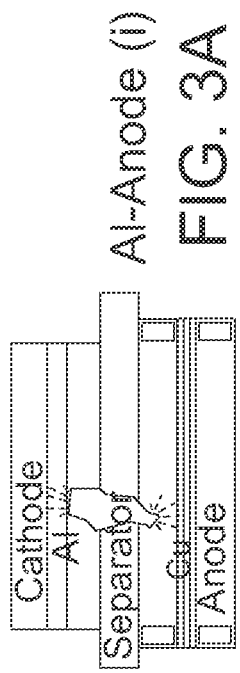
FIG. 3B Al-Anode (o)
FIG. 3D Al-Cu (o)
FIG. 3F Cathode-Cu (o)
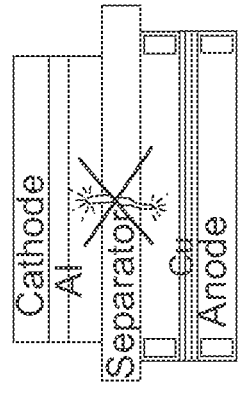
FIG. 3H Soft Short

SYSTEM AND METHOD FOR DIFFERENTIATING SHORTING IN A BATTERY

RELATED APPLICATION

This application is a Divisional of U.S. application Ser. No. 16/877,954, filed May 19, 2020, which claims priority to U.S. application Ser. No. 14/754,744, filed Jun. 30, 2015, and issued as U.S. Pat. No. 10,656,195 on May 19, 2020, which claims priority to and the benefit of co-pending U.S. provisional patent application Ser. No. 62/018,930 filed Jun. 30, 2014, incorporated herein by reference.

FIELD OF THE INVENTION

The invention is directed to new or improved systems and/or methods for differentiating short circuiting in batteries, particularly lithium secondary batteries, and/or for differentiating and/or responding thereto, safety systems, alarms, and/or the like.

BACKGROUND

In advanced battery systems, for example lithium battery systems, short circuiting is a serious problem that may lead to consequences from: battery under-performance, battery failure, battery rupture, or more. The shorting problem is a major concern of not only battery users, but also battery manufacturers and the suppliers of battery components. The causes and mechanisms of the shorting process are not well understood.

SUMMARY OF THE INVENTION

In accordance with at least selected embodiments, the invention is directed to and/or may address the above issues or needs, and/or may provide new or improved systems and/or methods for differentiating short circuiting in batteries, particularly lithium secondary batteries, and/or for differentiating and/or responding thereto, safety systems, alarms, and/or the like.

In accordance with at least certain embodiments, a system for differentiating short circuiting in a battery includes: at least one detector means coupled to the battery or cell; a monitor means in communication with the detector, the monitor means including at least one profile of a battery shorting behavior, and a comparator means for matching data from the detector means to the profile; and a controller means for taking action based upon information from the detector means. The system may monitor: temperature of the battery, heat generation from the battery, current flow through the battery, voltage drop across the battery, and/or combinations thereof. The system may discriminate between the various battery shorting behaviors for dictating an aggressive response or a passive response.

In accordance with at least certain selected embodiments, a method for detecting, monitoring and reacting to short circuiting in a battery or cell includes the steps of: detecting a behavior of the battery; comparing the behavior of the battery to at least one predetermined battery behavior profile; determining the type of short based on the comparison; and taking particular mitigating action based on the determination. The method may include the steps of monitoring: temperature of the battery, heat generation from the battery, current flow through the battery, voltage drop across the battery, and/or combinations thereof. The method may also include the steps of discriminating between the various battery shorting behaviors for determining and dictating an aggressive response or a more passive response.

The battery may be at least one of a battery, cell, pack, system, module (a plurality of cells coupled together), large pack (a plurality of modules coupled together), secondary (rechargeable) battery, lithium battery, lithium primary battery, lithium secondary battery, lithium secondary cell, polymer battery, gel battery, lithium ion battery, lithium metal battery, lithium alloy battery, lithium air battery, any battery where the ionic transport particle is a lithium ion, energy storage device, accumulator, capacitor, CE, EV, ESS, or BESS battery, cell, system or pack, or combinations thereof.

In accordance with at least certain embodiments, a system for differentiating short circuiting in a battery includes: a detector coupled to the battery; a monitor in communication with the detector, the monitor including a profile of a battery shorting behavior, and a comparator for matching data from the detector to the profile; and a controller for taking action based upon information from the detector. A method for detecting short circuiting in a battery includes the steps of: detecting a behavior of the battery; comparing the behavior of the battery to a predetermined battery behavior profile; determining the type of short based on the comparison; and taking mitigating action based on the determination. The system/method may monitor: temperature of the battery, heat generation from the battery, current flow through the battery, voltage drop across the battery, and/or combinations thereof. The system/method discriminates between the various battery shorting behaviors for aggressive response or passive response.

DESCRIPTION OF THE DRAWINGS

For the purpose of illustrating at least exemplary embodiments, aspects or objects of the invention, there is shown in the drawings a form that is presently preferred; it being understood, however, that the invention is not limited to the precise arrangements and instrumentalities shown.

FIGS. 3A-H are schematic illustrations of various categories (or types) of battery short circuiting.

versus time, for some types of short circuits when the battery has an uncoated and coated separator.

Figure 10:
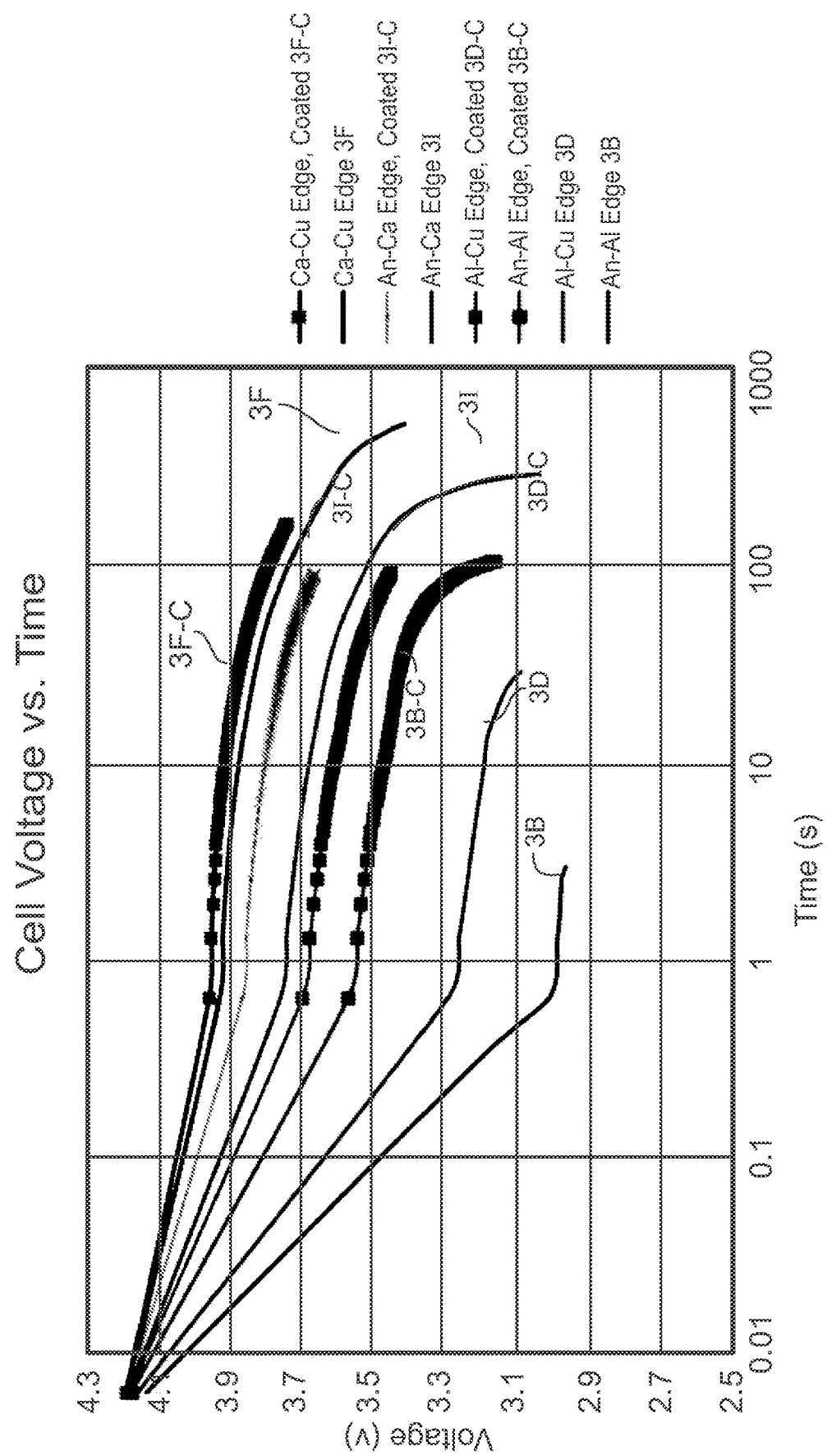

FIG. 10 is a graph illustrating battery shorting circuiting profiles (or behaviors), voltage drop across the battery versus time, for some types of short circuits when the battery has an uncoated and coated separator.

Figure 11:
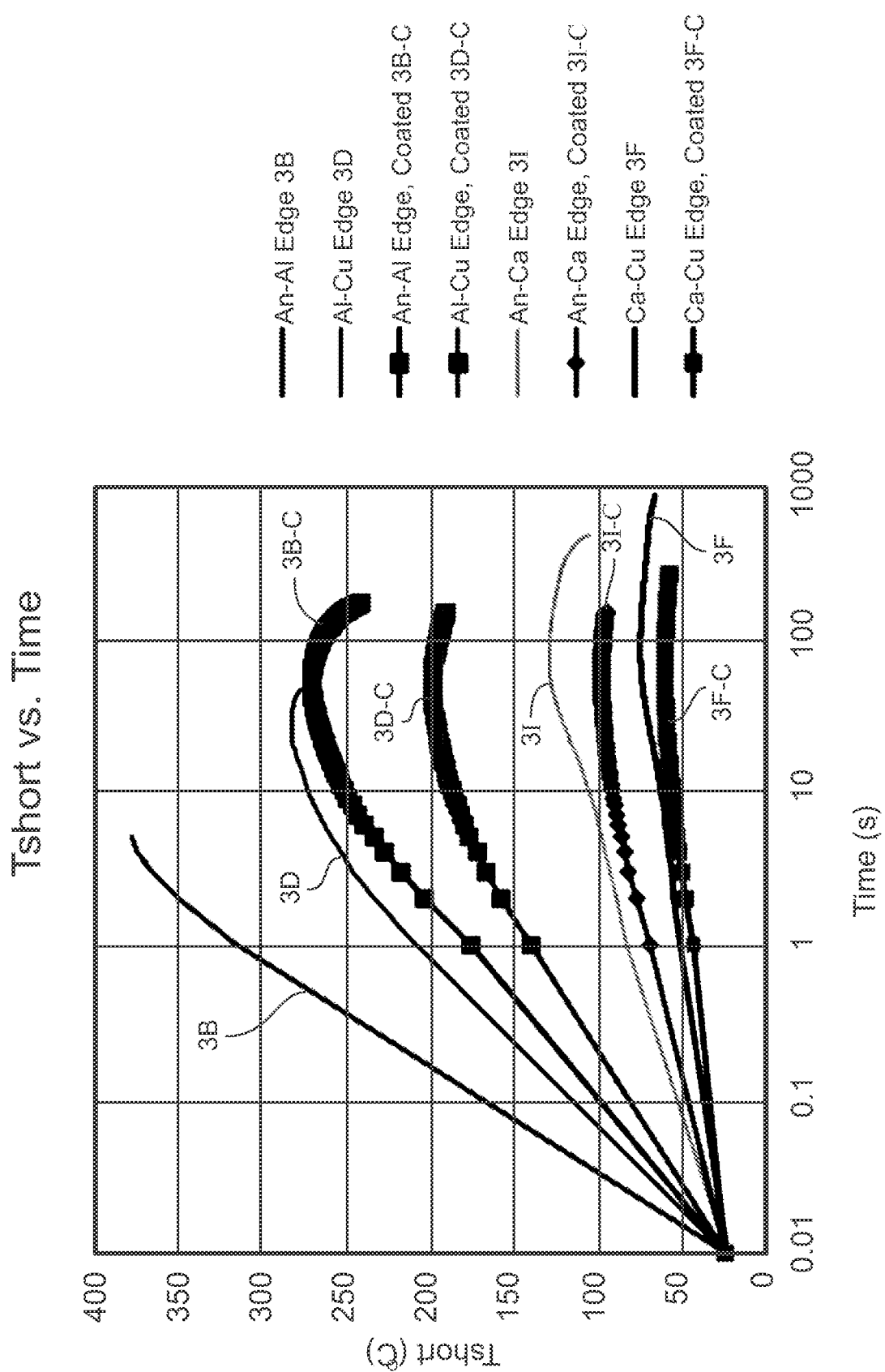

FIG. 11 is a graph illustrating battery shorting circuiting profiles (or behaviors), temperature of the battery (short spot) versus time, for some types of short circuits when the battery has an uncoated and coated separator.

Figure 12:
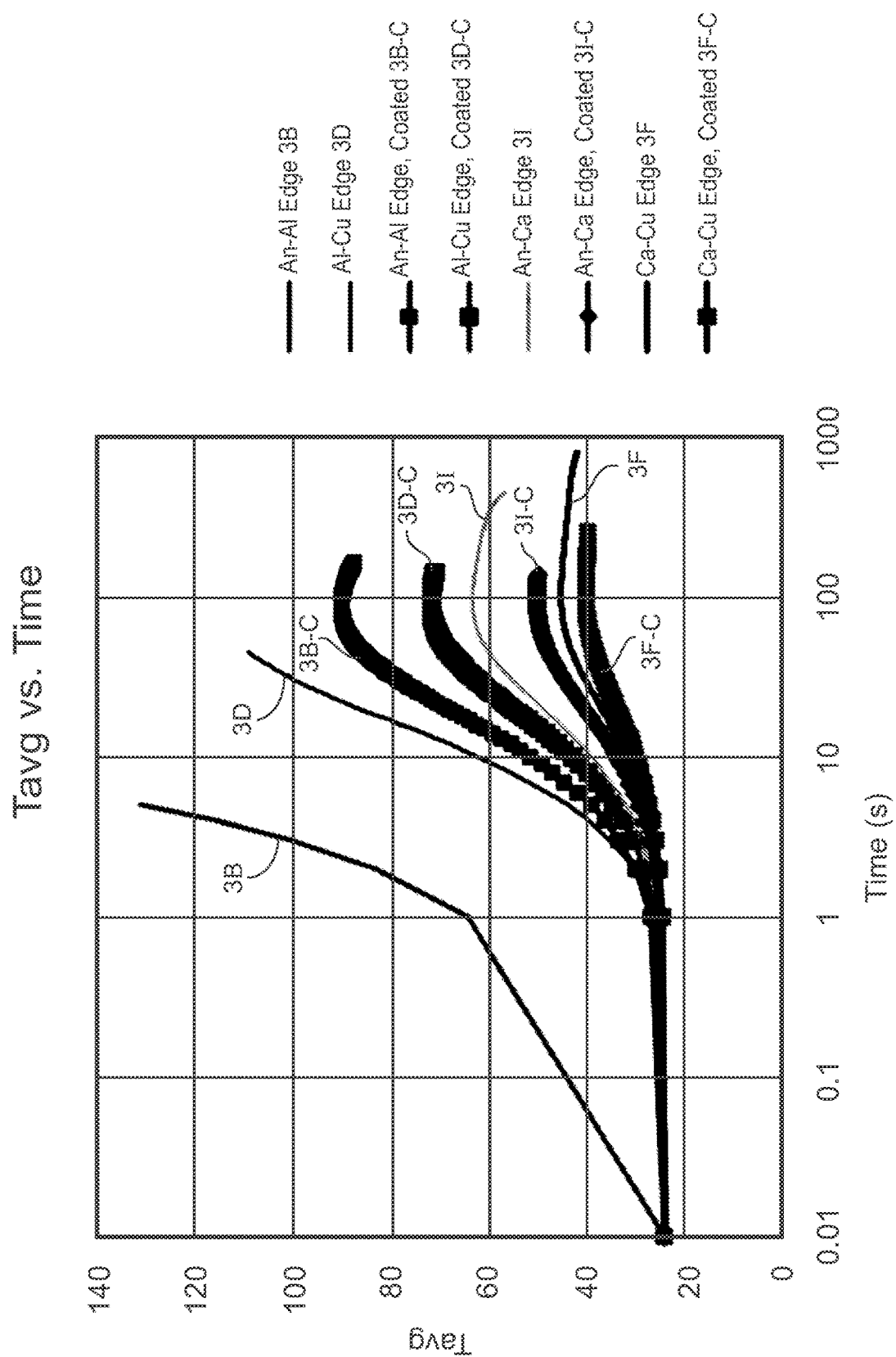

FIG. 12 is a graph illustrating battery shorting circuiting profiles (or behaviors), temperature of the battery (average) versus time, for some types of short circuits when the battery has an uncoated and coated separator.

DESCRIPTION OF THE INVENTION

Figure 1:
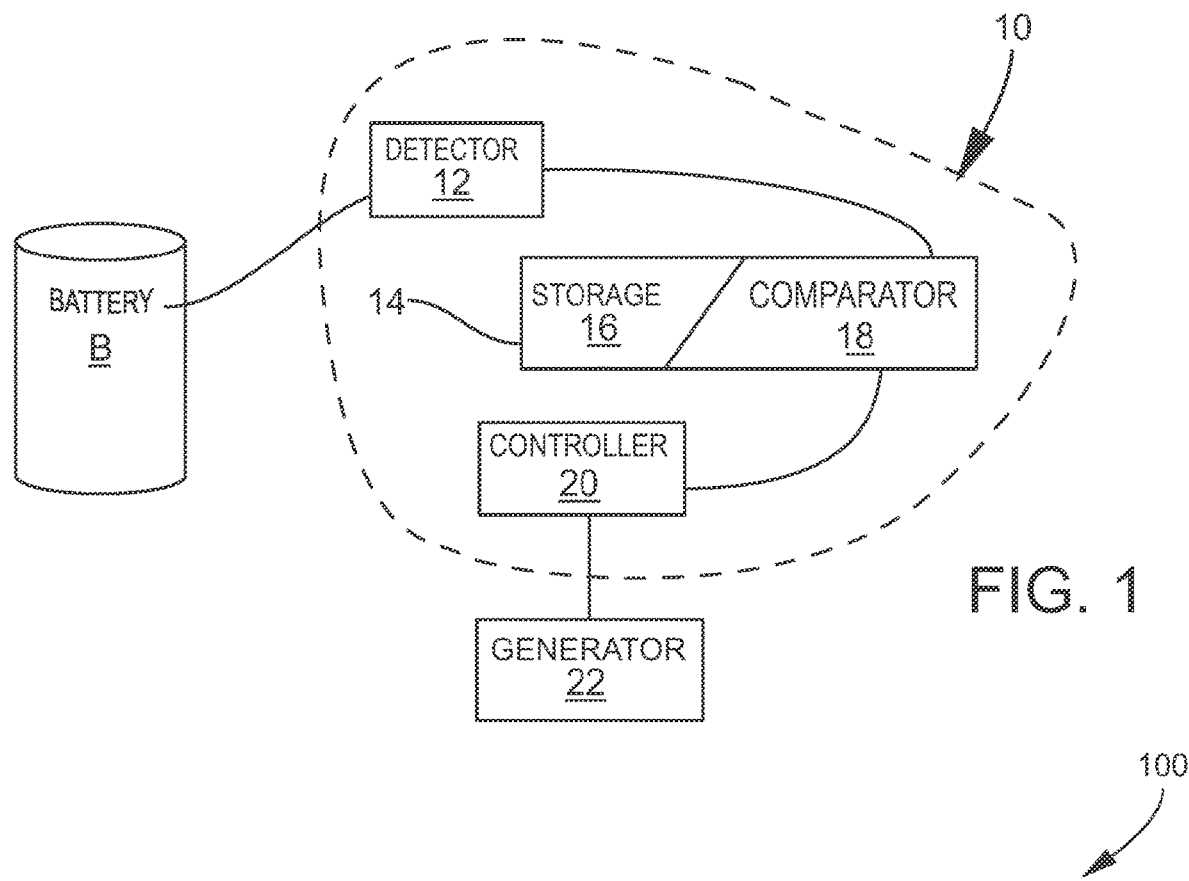
FIG. 1 is a schematic illustration of an embodiment of the invention (system).

Referring to the drawings, where like numerals indicate like elements, there is shown, in FIG. 1, an embodiment of the invention, system 10 for at least differentiating (or predicting) short circuiting in a battery. System 10 is in communication with (or connected to, or coupled with) a battery B.

Battery B may be any type of battery. Battery, as used herein, may be understood to include: individual cells, modules (a plurality of cells coupled together), and/or packs (a plurality of modules coupled together). Battery B may be any type of secondary (rechargeable) battery. In one preferred embodiment, the battery B may be a lithium secondary battery or cell. To simply the discussion below, the battery will be referred to as a lithium (Li) battery, it being understood that the invention, however, is not so limited. Anode (−)(negative plate or electrode) and cathode (+) (positive plate or electrode), as used herein, refer to the discharge state of the battery, unless otherwise noted. Materials for the battery may be any convention battery materials. Anode, as used herein, refers to any conventional anode material. Cathode, as used herein, refers to any conventional cathode material. Conventional anode and cathode materials are described in: Linden, D., *Handbook of Batteries, Second Edition*, McGraw-Hill, Inc. New York, NY (1995); Besenhard, J. O., *Handbook of Battery Materials*, Wiley-VCH, New York, NY (1999): and Arora, P. & Zhang, Z., *Battery Separators*, Chem. Rev., 2004, 104, 4419-4462, all incorporated herein by reference. For lithium secondary batteries, see: Linden, Ibid., chapter 36; Besenhard, Ibid., Part III, chapters 3-10; and Arora & Zhang, all incorporated herein by reference.

System 10 for differentiating (or predicting) short circuiting in a battery, in one embodiment, generally includes: a detection device (detector) 12 coupled to the battery B; a monitoring device (monitor) 14 in communication with the detection device (detector) 12, the monitoring device (monitor) 14 including a profile of a battery shorting behavior (located in a storage device 16), and a comparator 18 for matching data from the detector 12 to said profile in storage device 16; and a control logic device (controller) 20 for taking action based upon information from the detection device. System 10 may optionally include an action or response generator 22 in communication with system 10 (as shown in communication with control logic device 20).

To better understand the invention, the premise (or theory) of operation will be discussed hereinafter, but the invention is not bound by this premise (or theory). As mentioned in the Background section above, short circuiting in batteries, for example lithium secondary batteries, is not well understood. After extensive study, it has been determined that battery short circuiting may be grouped (or characterized or differentiated) by various physical attributes (or characteristics or behaviors). Those attributes may be the physical characteristics of the short while it is developing, and/or the results (or consequences) of the short. By differentiating between various types of shorting (for example the measured parameter as a function of time), it may be possible to address and/or improve battery safety and/or performance, responses to shorts, limiting the response to certain shorts, and/or heightening the response to other shorts, and/or combinations thereof.

To illustrate the foregoing, reference is made to FIGS. 3A-H. FIGS. 3A-H list or illustrate several exemplary types (or groups or categories) of short circuits. The exemplary short circuits listed in FIGS. 3A-H have been developed with specific regard to lithium secondary batteries, but like groups may relate to or be created for other types of batteries or energy storage devices (batteries, cells, modules, packs, systems, accumulators, capacitors, CE, EV, ESS, or BESS systems or packs, and/or the like.

FIG. 3A is a short between the cathode current collector (in a Li battery, this may be an aluminum (Al) film) and the anode. This short may be referred to as an internal short and/or a hard short. This short may evolve large amounts of energy. This may be a dangerous short.

FIG. 3B is a short between the cathode current collector (in a Li battery, this may be an aluminum (Al) film) and an end of the anode. This short may be referred to as an external short and/or a hard short. This short may evolve large amounts of energy. This may be a dangerous short.

FIG. 3C is a short between the cathode current collector (in a Li battery, this may be an aluminum (Al) film) and the anode current collector (in a Li battery, this may be a copper (Cu) film). This short may be referred to as an internal short and/or a hard short. This short may evolve large amounts of energy. This may be a dangerous short.

FIG. 3D is a short between an end of the cathode current collector (in a Li battery, this may be an aluminum (Al) film) and an end of the anode current collector (in a Li battery, this may be a copper (Cu) film). This short may be referred to as an external short and/or a hard short. This short may evolve large amounts of energy. This may be a dangerous short.

FIG. 3E is a short between the cathode and the anode current collector (in a Li battery, this may be a copper (Cu) film). This short may be referred to as an internal short and/or a hard short. This short may evolve lesser amounts of energy (compared to the shorts mentioned in FIGS. 3A-D). This may be a less dangerous short (compared to the shorts mentioned in FIGS. 3A-D).

FIG. 3F is a short between the cathode and an edge of the anode current collector (in a Li battery, this may be a copper (Cu) film). This short may be referred to as an internal short and/or a hard short. This short may evolve lesser amounts of energy (compared to the shorts mentioned in FIGS. 3A-D). This may be a less dangerous short (compared to the shorts mentioned in FIGS. 3A-D).

FIG. 3G is a short between the cathode and the anode. This short may be referred to as an internal short and/or a hard short. This short may evolve lesser amounts of energy (compared to the shorts mentioned in FIGS. 3A-D). This may be a less dangerous short (compared to the shorts mentioned in FIGS. 3A-D).

FIG. 3H is a short between the cathode and the anode. This short may be referred to as an internal short and/or a soft short. This short occurs frequently in a relatively healthy battery. This short may be considered even less dangerous or not dangerous.

Another type of short (not shown in FIGS. 3A-H) is a short between the edges of the cathode and the anode, hereinafter referred to as 3I.

With several types of shorts identified, their behaviors (or the profile of a battery shorting behavior) may be studied and modeled (either empirically or mathematically). External parameters, that may be measured while the battery is in operation, include, but are not limited to: temperature, energy (e.g., heat), voltage, current, resistance, and combinations thereof. Temperature may refer to the temperature at the spot (or point) of the short (shortspot), or the temperature may refer to the temperature of the battery or cell (average). These external parameters may be measured as a function of, for example: time and/or temperature. The analysis of these parameters may be accomplished in any conventional manner. For example, voltage drop (e.g., volts) may be measured with a voltmeter (preferably as a function of time). Current (e.g., amps) may be measured with an ammeter (preferably as a function of time). Resistance (e.g., ohms) may be measured with an ohmmeter (preferably as a function of time). Temperature (e.g., ° C.) may be measured with a thermometer (preferably as a function of time). The temperature measurement may be measured with a thermocouple or sensor placed on the interior or exterior of the battery and/or with a thermal image scanner (better for measuring the internal temperature of the battery). Heat generation (e.g. calories) may be measured with a calorimeter (preferably as a function of time). Based upon these external parameters, profiles of a batteries shorting behavior may be generated.

Figure 4:
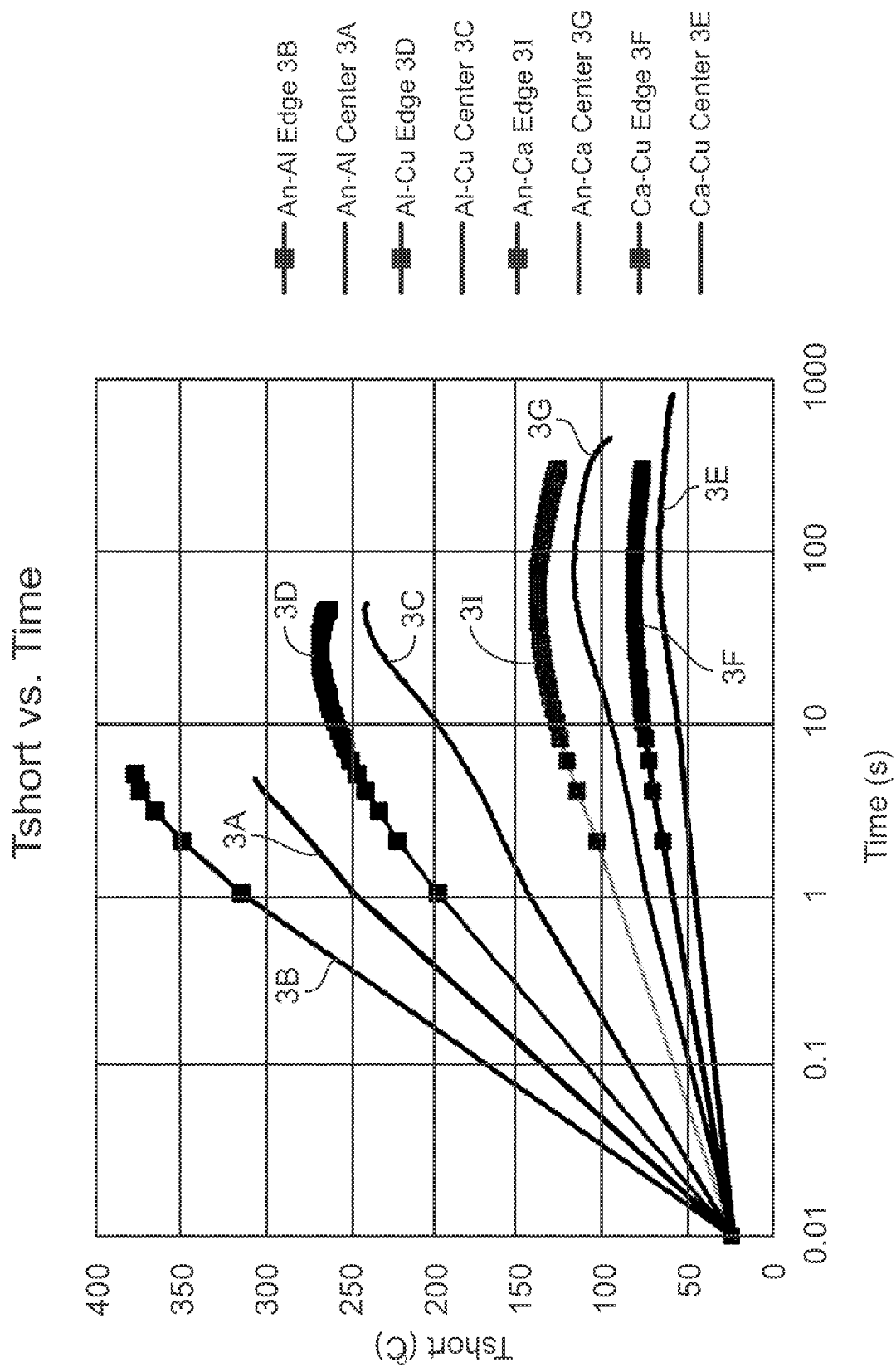
FIG. 4 is a graph illustrating battery shorting circuiting profiles (or behaviors), temperature at the point of the short (shortspot) versus time, for some types of short circuits when the battery has an uncoated separator.
Figure 5:
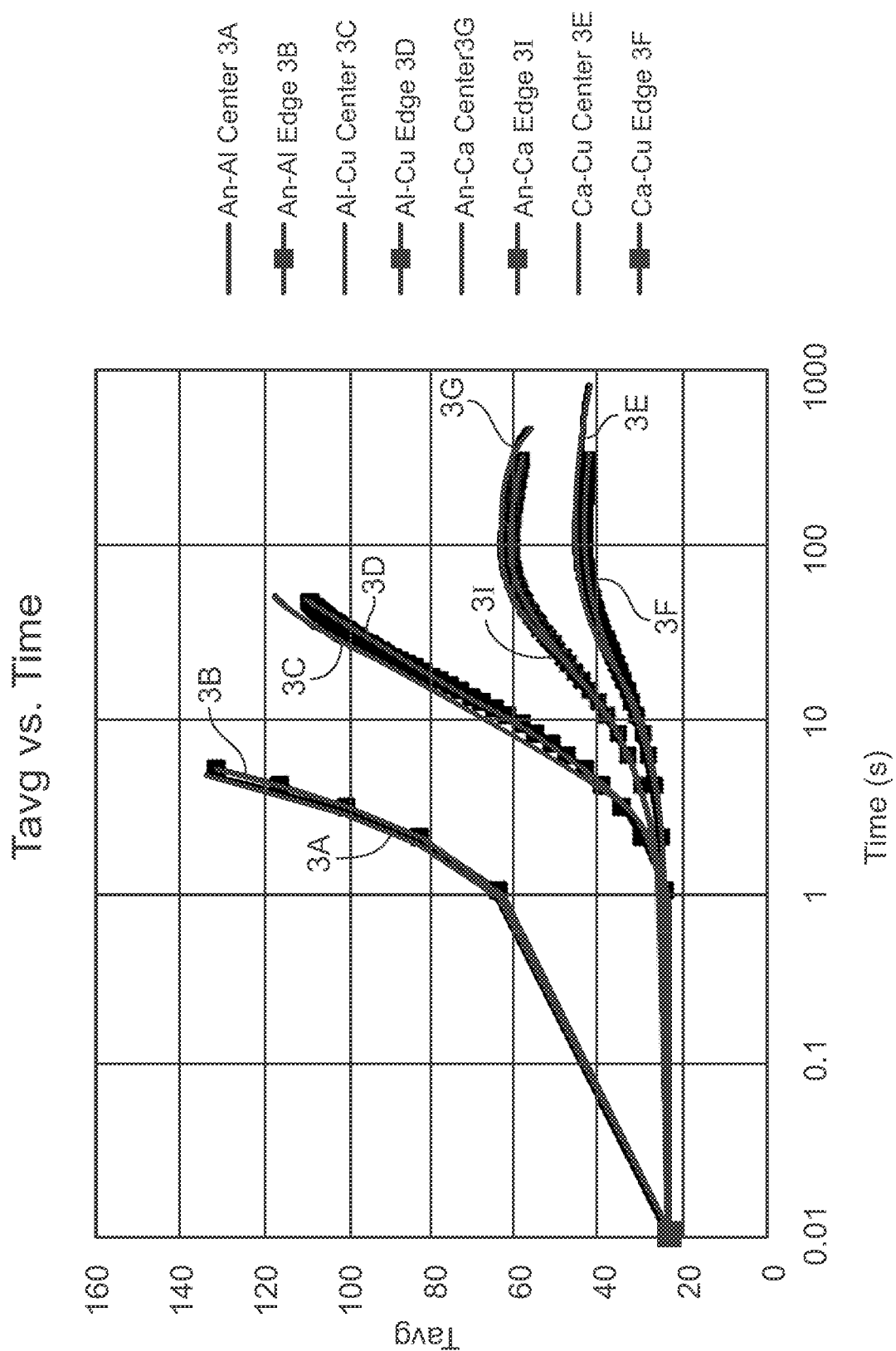
FIG. 5 is a graph illustrating battery shorting circuiting profiles (or behaviors), temperature of the battery (average) versus time, for some types of short circuits when the battery has an uncoated separator.
Figure 6:
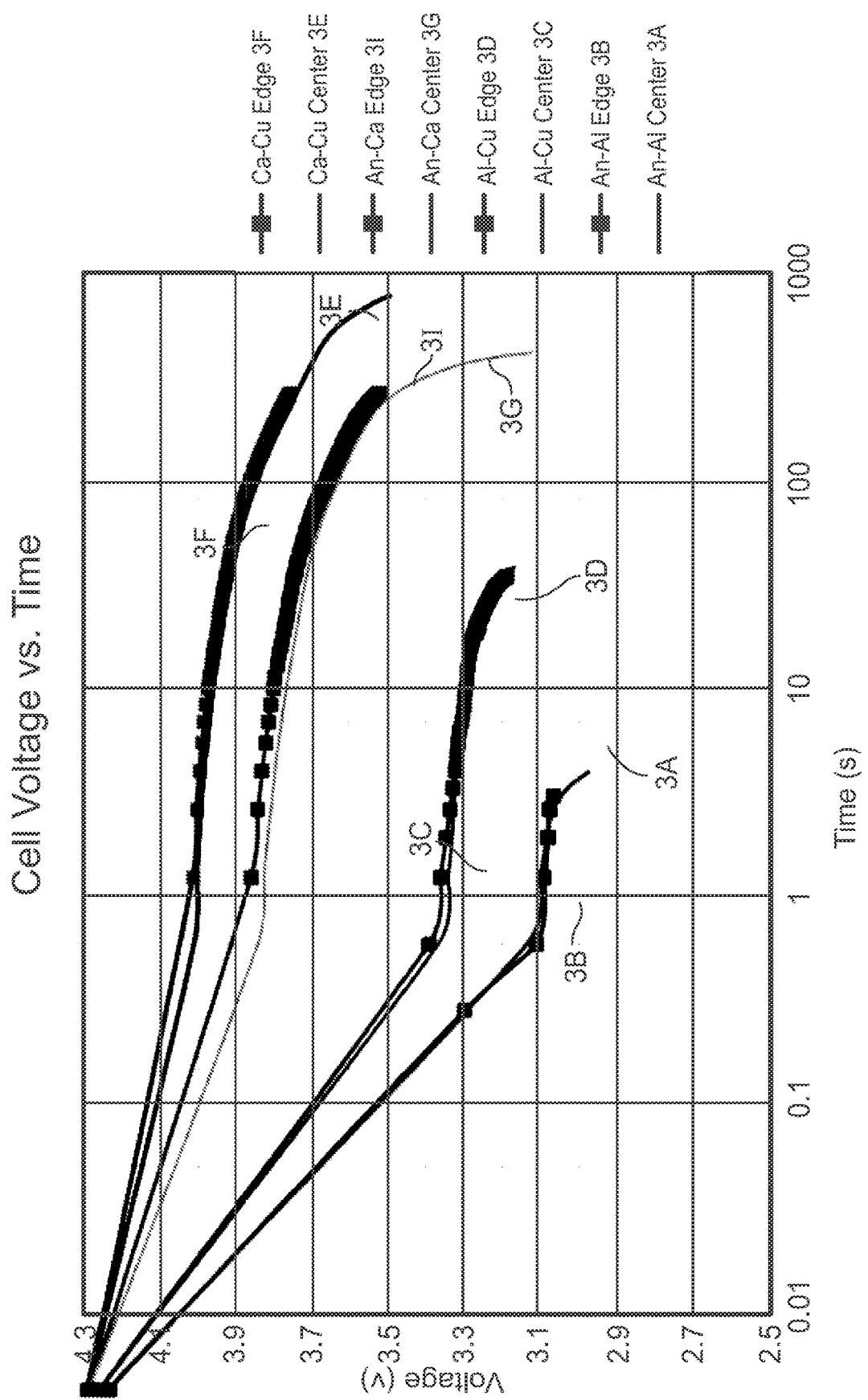
FIG. 6 is a graph illustrating battery shorting circuiting profiles (or behaviors), voltage drop across the battery versus time, for some types of short circuits when the battery has an uncoated separator.
Figure 7:
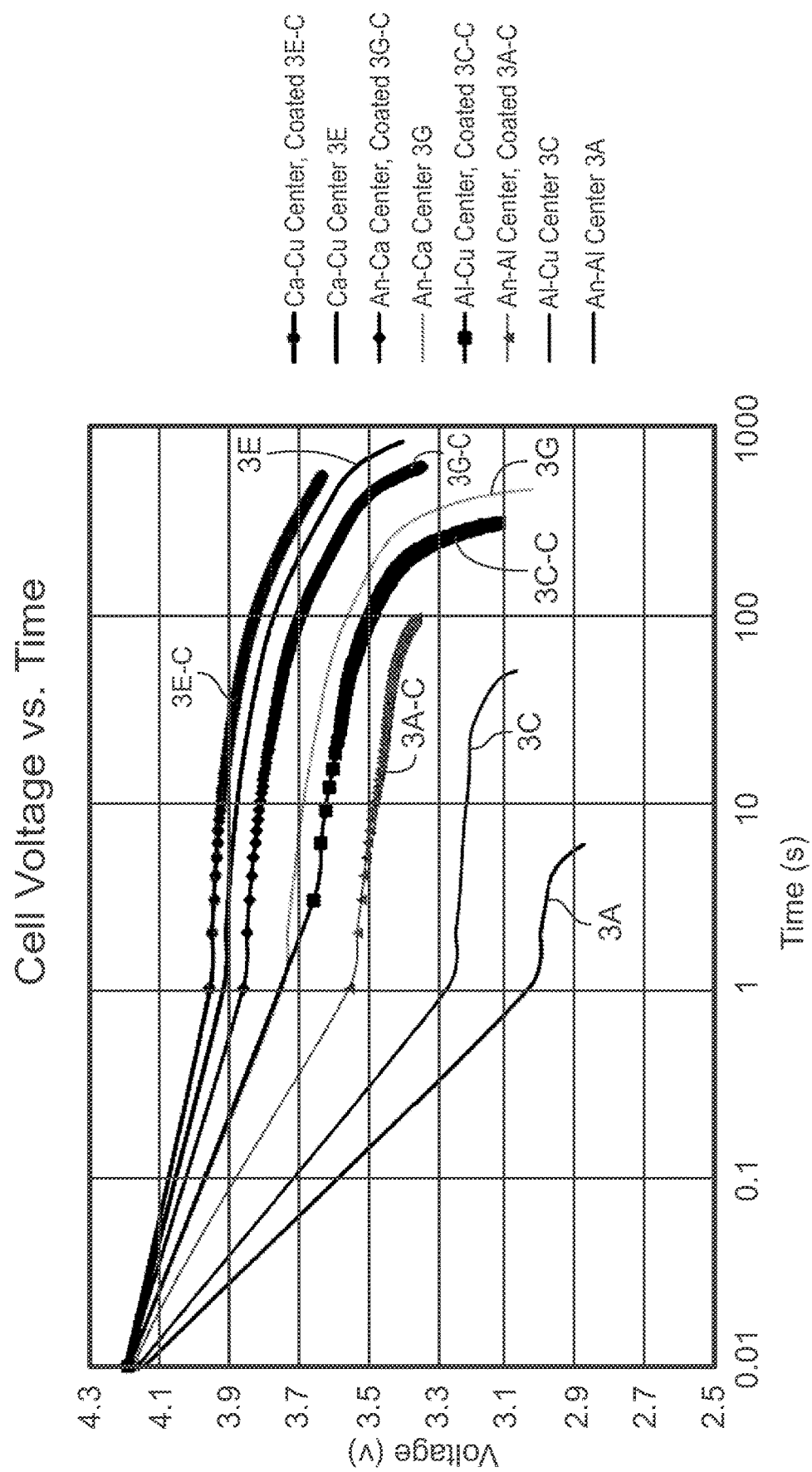
FIG. 7 is a graph illustrating battery shorting circuiting profiles (or behaviors), voltage drop across the battery versus time, for some types of short circuits when the battery has an uncoated and coated separator.
Figure 8:
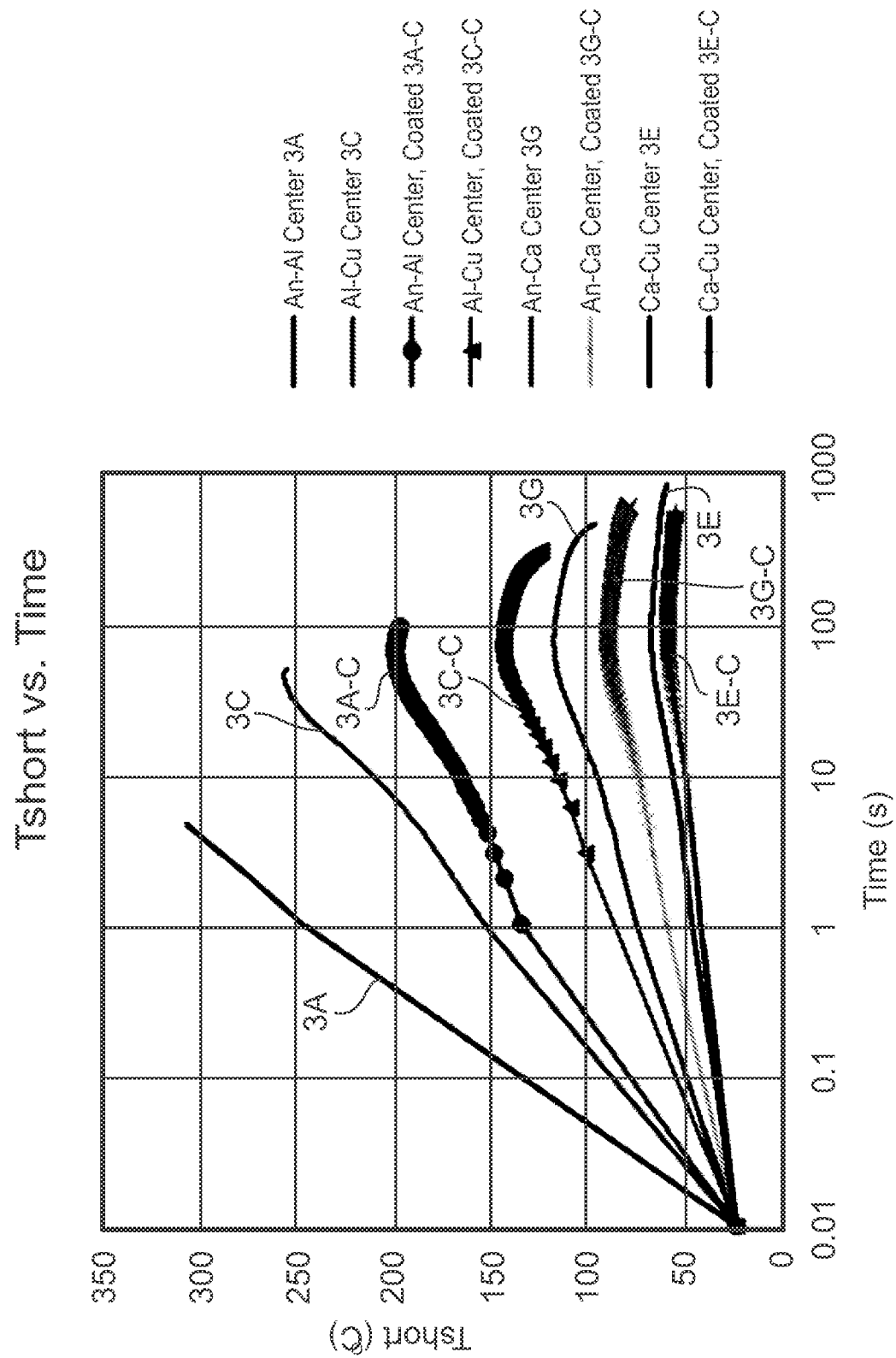
FIG. 8 is a graph illustrating battery shorting circuiting profiles (or behaviors), temperature of the battery (short spot) versus time, for some types of short circuits when the battery has an uncoated and coated separator.
Figure 9:
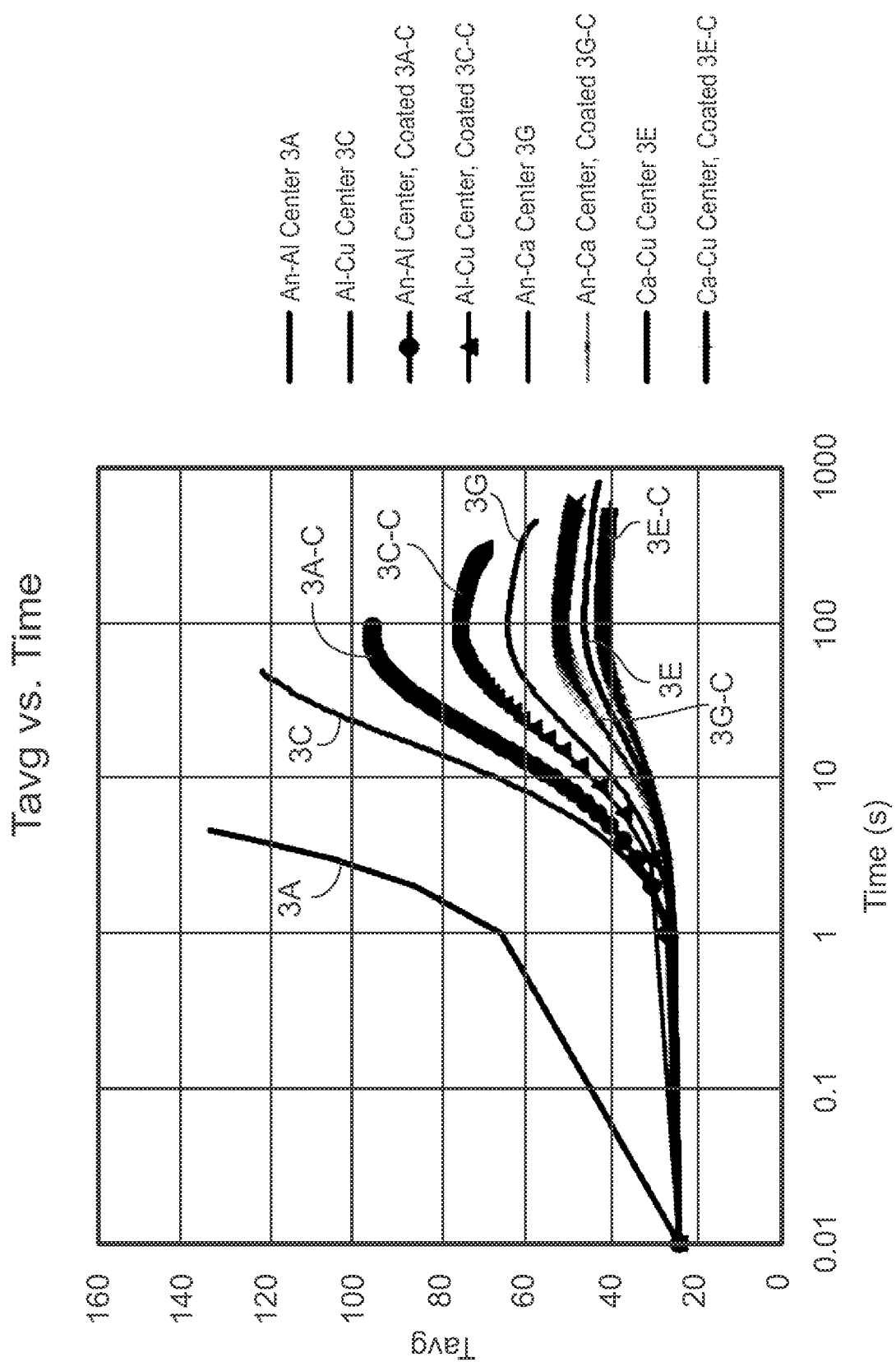
FIG. 9 is a graph illustrating battery shorting circuiting profiles (or behaviors), temperature of the battery (average)

Examples of representative profiles are illustrated in FIGS. 4-12. With regard to FIGS. 4-12, base film or uncoated separator refers to a microporous membrane without any ceramic filled coating on the exterior surface of the membrane, and coated or coated separator refers to a microporous membrane with a ceramic coating on at least one or both of the exterior surfaces of the membrane. Shorting types referred to in FIGS. 4-12 are identified by reference to the foregoing discussion. FIG. 4 illustrates the shorting profiles of various shorting types (3A, 3B, 3C, 3D, 3E, 3F, 3G, 3I) as temperature (shortspot) as a function of time. FIG. 5 illustrates the shorting profiles of various shorting types (3A, 3B, 3C, 3D, 3E, 3F, 3G, 3I) as temperature (average) as a function of time. FIG. 6 illustrates the shorting profiles of various shorting types (3A, 3B, 3C, 3D, 3E, 3F, 3G, 3I) as voltage as a function of time. FIG. 7 illustrates the shorting profiles of various shorting types (3A, 3C, 3E, 3G) of uncoated and coated (-c) separators as voltage drop as a function of time. FIG. 8 illustrates the shorting profiles of various shorting types (3A, 3C, 3E, 3G) of uncoated and coated (-c) separators as temperature (shortspot) as a function of time. FIG. 9 illustrates the shorting profiles of various shorting types (3A, 3C, 3E, 3G) of uncoated and coated (-c) separators as temperature (average) as a function of time. FIG. 10 illustrates the shorting profiles of various shorting types (3B, 3D, 3F, 3I) of uncoated and coated (-c) separators as voltage drop as a function of time. FIG. 11 illustrates the shorting profiles of various shorting types (3B, 3D, 3F, 3I) of uncoated and coated (-c) separators as temperature (shortspot) as a function of time. FIG. 12 illustrates the shorting profiles of various shorting types (3B, 3D, 3F, 3I) of uncoated and coated (-c) separators as temperature (average) as a function of time.

Each short will have a unique profile that differentiates one short from another short. Moreover, these shorting behaviors may be expressed mathematically or defined in a 'look-up' table for subsequent use in the inventive system and/or method.

Each of these shorts may produce a result in the battery. But, the results may not be the same. Some results may be more or less severe than others. In other words, some shorts may require immediate action (an aggressive response), while other shorts may not require immediate action, or no action at all (a passive response). An aggressive or passive response may be any response deemed appropriate to the consequence of the short. An aggressive response may include, but is not limited to: evacuate the premises (the battery cannot be saved), or the battery will burn, or eject the battery, or rapidly cool the battery. A passive response may include, but is not limited to: have the battery checked at the earliest convenience (no immediate danger). The inventive system or method may be part of and/or work along with other safety features of the building security or fire safety systems, battery or cell safety features, such as, but not limited to, the battery or pack electrical and/or cooling switch, shutdown separators, ceramic coated separators, HTMI separators, and/or the like.

System 10, as mentioned above, generally includes: a detection device (detector) 12; a monitoring device (monitor) 14 with a profile of a battery shorting behavior (located in a storage device 16), and a comparator 18; and a control logic device (controller) 20. System 10 may optionally include an action or alarm generator (actuator) 22 in communication with system 10.

Detection device (detector) 12 is in communication with battery B. Detection device 12 may include sensors for measuring temperature, energy (e.g., heat), voltage, current, and/or resistance, alone and/or as a function of time and/or temperature. The information about the batteries operation (or behavior) is captured by the detector 12 and is communicated to the monitoring device 14.

Monitoring device (monitor) 14 generally includes a storage device 16 and a comparator 18. Storage device 16 (which may be in monitor 14 or elsewhere in system 10) is used to retain the predetermined profiles of various battery shorting behaviors. These profiles may be stored in the form of mathematical formulas or 'look-up' tables. The comparator 18 is used to compare the information from detector 12 with the profile stored in file 16. When the comparator 18 determines there is a match between the information from detector 12 and a profile in file 16, a message is sent to control logic device (controller) 20.

Control logic device (controller) 20 determines what response, if any, should be taken to mitigate or resolve the short issue. Suitable predetermined response for each short may be stored in the controller 20 (or elsewhere in system 10). When the message from the monitor 14 is sent, the controller 20 looks up the predetermined response. As appropriate, the controller 20 may send a message or instruction to action generator (actuator) 22.

Action generator (actuator) 22 is a device to carry out the mitigating response. The actuator may be, for example: an alarm (e.g., klaxon or warning light), a shut-off switch, a coolant and/or quench system, a barricade (e.g., to isolate the battery at risk), and/or the like.

Figure 2:
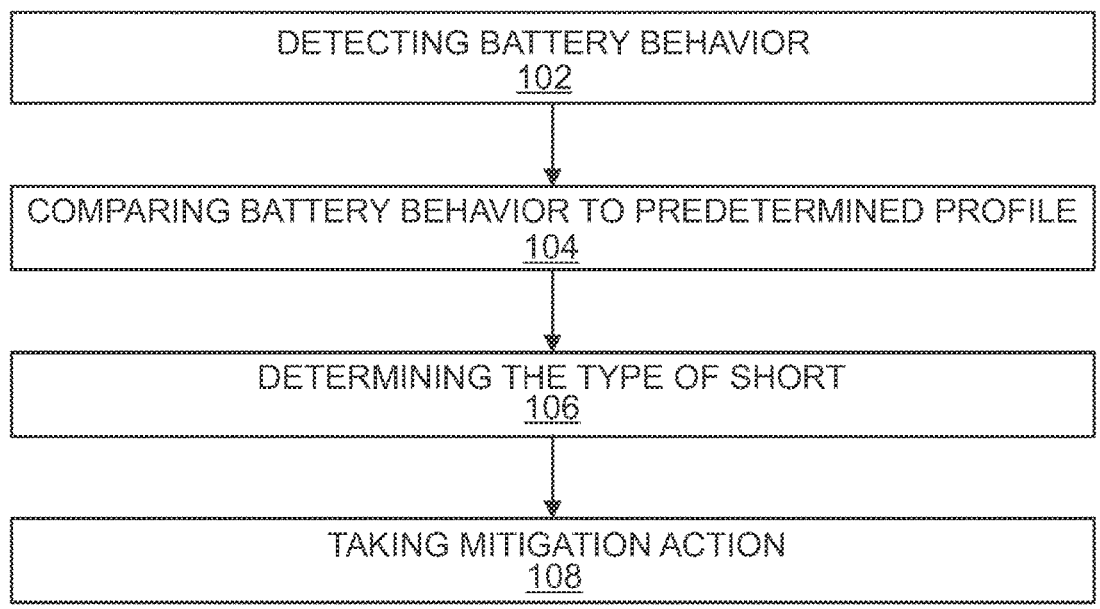
FIG. 2 is a flow chart illustrating an embodiment of the invention (method).

The method 100 for detecting and mitigating based on short circuiting in a battery is illustrated in the flow chart shown in FIG. 2. The method 100 for detecting short circuiting in a battery generally includes the steps of: detecting 102 the behavior of a battery; comparing 104 the behavior of the battery to a predetermined battery behavior profile: determining 106 the type of short based on the comparison; and taking mitigating action 108 based on the prediction. Details of these steps correspond to the system 10 discussed above.

The foregoing system 10/method 100 may be used in various applications including but not limited to: laboratories, testing facilities, alarm systems, battery control systems, vehicles (automobiles, planes, trains, etc.), energy storage systems, smart grids, home energy storage systems, and the like.

In accordance with at least selected embodiments, aspects, or objects, the invention is directed to and/or may address the above issues or needs, and/or may provide new or improved systems and/or methods for differentiating short circuiting in batteries, particularly lithium secondary batteries, and/or for differentiating and/or responding thereto, safety systems, alarms, and/or the like.

In accordance with at least certain embodiments, aspects, or objects, a system for differentiating short circuiting in a battery includes: at least one detector means coupled to the battery or cell; a monitor means in communication with the detector, the monitor means including at least one profile of a battery shorting behavior, and a comparator means for matching data from the detector means to the profile; and a controller means for taking action based upon information from the detector means. The system may monitor: temperature of the battery, heat generation from the battery, current flow through the battery, voltage drop across the battery, and/or combinations thereof. The system may discriminate between the various battery shorting behaviors for dictating an aggressive response or a passive response.

In accordance with at least certain selected embodiments, aspects, or objects, a method for detecting, monitoring and reacting to short circuiting in a battery or cell includes the steps of: detecting a behavior of the battery; comparing the behavior of the battery to at least one predetermined battery behavior profile; determining the type of short based on the comparison; and taking particular mitigating action based on the determination. The method may include the steps of monitoring: temperature of the battery, heat generation from the battery, current flow through the battery, voltage drop across the battery, and/or combinations thereof. The method may also include the steps of discriminating between the various battery shorting behaviors for determining and dictating an aggressive response or a more passive response.

In accordance with at least certain embodiments, aspects, or objects, a system for differentiating short circuiting in a battery includes: a detector coupled to the battery; a monitor in communication with the detector, the monitor including a profile of a battery shorting behavior, and a comparator for matching data from the detector to the profile; and a controller for taking action based upon information from the detector. A method for detecting short circuiting in a battery includes the steps of: detecting a behavior of the battery; comparing the behavior of the battery to a predetermined battery behavior profile; determining the type of short based on the comparison; and taking mitigating action based on the determination. The system/method may monitor: temperature of the battery, heat generation from the battery, current flow through the battery, voltage drop across the battery, and/or combinations thereof. The system/method discriminates between the various battery shorting behaviors for aggressive response or passive response.

The present invention may be embodied in other forms without departing from the spirit and the essential attributes thereof, and, accordingly, reference should be made to the appended claims, rather than limited to the foregoing specification and attached drawings, as indicative of the scope of the invention.

We claim:

1. A system for differentiating and mitigating based on short circuiting in a battery comprises:
    a detector coupled to the battery during discharge, wherein the detector measures voltage as a function of time and/or temperature;
    a monitor in communication with the detector, the monitor including more than one predetermined profile of a battery shorting behavior, the profiles are based on empirically or mathematically modeled shorting behavior including temperature as a function of time and voltage as a function of time and are grouped as dangerous shorts and less dangerous shorts, and a comparator for matching data from the detector to the profiles;
    a controller for sending instructions or taking action based upon information from the detector; and
    an actuator for taking action based upon instructions from the controller.

2. The system of claim 1, wherein the battery is at least one of a battery, cell, pack, system, module, secondary battery, lithium secondary battery, lithium secondary cell, polymer battery, gel battery, lithium ion battery, energy storage device, accumulator, capacitor, CE, EV, ESS, or BESS battery, cell, system or pack, or combinations thereof.

3. The system of claim 1, wherein the battery is a lithium battery.

* * * * *